United States Patent [19]

Takano et al.

[11] Patent Number: 5,243,382
[45] Date of Patent: Sep. 7, 1993

[54] IMAGE FORMING APPARATUS CAPABLE OF EFFICIENT MAINTENANCE WORK

[75] Inventors: Yoshiaki Takano, Toyohashi; Tadafumi Shimizu, Toyokawa; Hiroyuki Ideyama, Toyokawa; Manabu Kamitamari, Toyokawa; Kadotaro Nishimori, Amagasaki; Yoshihiko Hatta, Toyokawa; Masazumi Ito; Tsugihito Yoshiyama, both of Toyohashi; Yoshifumi Shibata, Toyokawa; Yoshiaki Hata, Ashiya, all of Japan

[73] Assignee: Minolta Camera Kabushiki Kaisha, Osaka, Japan

[21] Appl. No.: 648,000

[22] Filed: Jan. 30, 1991

[30] Foreign Application Priority Data

Jan. 31, 1990 [JP] Japan ................... 2-22717
Jan. 31, 1990 [JP] Japan ................... 2-22718

[51] Int. Cl.$^5$ .................................. G03G 15/00
[52] U.S. Cl. ........................ 355/207; 355/203; 371/29.1
[58] Field of Search ........... 355/208, 204, 205, 206, 355/203, 207, 209; 364/550, 569, 525; 371/29.1, 16.4; 340/524, 525

[56] References Cited

U.S. PATENT DOCUMENTS

| | | | |
|---|---|---|---|
| 3,893,175 | 7/1975 | Solomon | 346/33 M |
| 3,997,873 | 12/1976 | Thornton | 340/149 R |
| 4,167,322 | 9/1979 | Yano et al. | 355/3 R |
| 4,322,813 | 3/1982 | Howard et al. | 364/900 |
| 4,390,953 | 6/1983 | Johnstone | 364/474 |
| 4,497,037 | 1/1985 | Kato et al. | 364/900 |
| 4,549,044 | 10/1985 | Durham | 179/5 R |
| 4,583,834 | 4/1986 | Seko et al. | 355/14 C |
| 4,589,080 | 5/1986 | Abbott et al. | 364/552 |
| 4,739,366 | 4/1988 | Braswell et al. | 355/14 SH |
| 4,766,548 | 8/1988 | Cedrone et al. | 364/479 |
| 4,771,865 | 9/1988 | Hinderling | 187/130 |
| 4,783,044 | 11/1988 | Swartztrauber et al. | 364/483 |
| 4,835,671 | 5/1989 | Sato et al. | 364/186 |
| 4,979,132 | 12/1990 | Sugimoto | 364/520 |
| 4,999,672 | 3/1991 | Rice, Jr. et al. | 355/202 |
| 5,023,817 | 6/1991 | Au | 364/550 |
| 5,057,866 | 10/1991 | Hill, Jr. et al. | 355/200 |
| 5,077,581 | 12/1991 | Suzuki | 355/200 |
| 5,077,582 | 12/1991 | Kravette et al. | 355/206 |
| 5,084,875 | 1/1992 | Weinberger et al. | 371/291 |

FOREIGN PATENT DOCUMENTS

| | | |
|---|---|---|
| 59-142559 | 2/1983 | Japan . |
| 60-90460 | 5/1985 | Japan . |
| 63-301667 | 4/1989 | Japan . |

OTHER PUBLICATIONS

Research Newsletter, Dataquest Inc., Feb. 1989, CDIS Newletter; "Remote Diagnostics-Tool Kit of the Future" pp. 1-6.

Primary Examiner—A. T. Grimley
Assistant Examiner—T. A. Dang
Attorney, Agent, or Firm—Burns, Doane, Swecker & Mathis

[57] ABSTRACT

A control system of image forming apparatus according to the present invention includes image forming apparatus and a portable maintenance device connectable thereto. The image forming apparatus transmits first condition data indicating conditions of the apparatus to the portable maintenance device when the portable maintenance device is connected thereto, and the portable maintenance device receives the condition data from the image forming apparatus when it is connected to the image forming apparatus. Also, the portable maintenance device can be input second condition data indicating conditions of the image forming apparatus, and displays at least one piece of stored guide information on the basis of the first and second condition data.

33 Claims, 12 Drawing Sheets

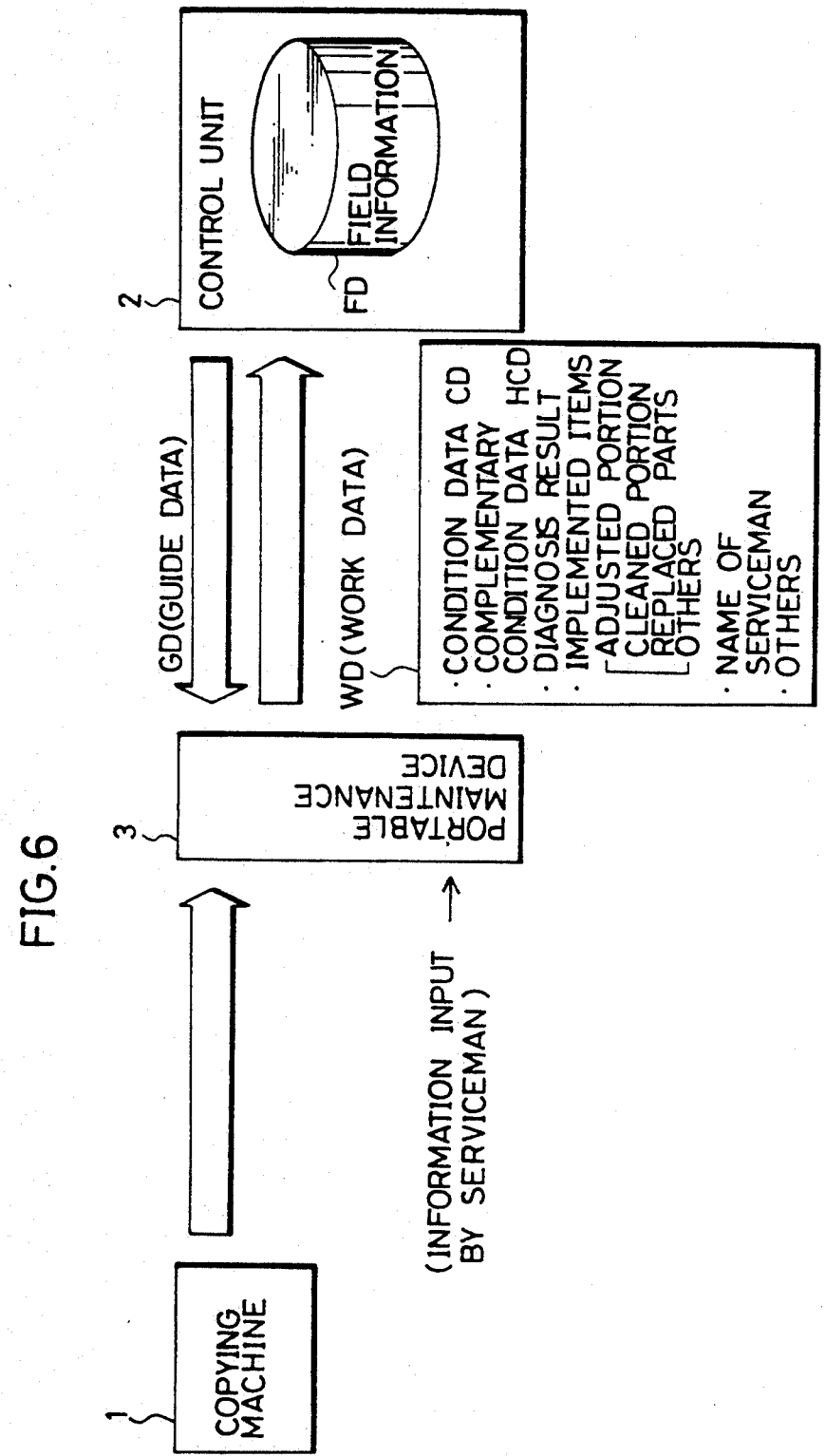

FIG.9A

```
╔══════════════════════════════════════╗
║      = TROUBLE DIAGNOSIS MODE =      ║
║                                      ║
║  ☆PHENOMENA                          ║
║    · THE DETECTED TEMPERATURE OF THE ║
║      THERMISTOR IS NOT MORE THAN 135°C.║
║  ☆INFORMATION IS INSUFFICIENT, CHECK THE║
║    FOLLOWING INFORMATION.            ║
║  ① IS BREAKER ON?    YES / NO        ║
║  ② THE HEATER LAMP WILL BE LIGHTED BY FORCE.║
║    VISUALLY CHECK THE LIGHTING CONDITION OF║
║    THE HEATER LAMP.                  ║
║    (TURN ON THE ENTER KEY WHEN YOU ARE║
║     READY)                           ║
║  WAS THE HEATER LAMP LIGHTED?  YES / NO║
║  ~A TROUBLE CAUSE IS NOW ESTIMATED~  ║
╚══════════════════════════════════════╝
```

```
╔══════════════════════════════════════╗
║      = TROUBLE DIAGNOSIS MODE =      ║
║                                      ║
║  ◎ ESTIMATED: A DEFECTIVE IN THE THRMISTOR║
║    CAUSE      CONTAMINANTS IN THE    ║
║               THRMISTOR              ║
║               A DEFECTIVE IN THE FIXING║
║               CONTROL PORTION        ║
║                                      ║
║  AMONG ABOVE ESTIMATED CAUSES, REFERRING║
║  TO TROUBLE OCCURENCE IN THE MARKET, ║
║  A DEFECTIVE IN THE FIXING CONTROL PORTION║
║  SEEMS TO BE THE CAUSE.              ║
║  FIRST, REPLACE THE FIXING CONTROL   ║
║  PORTION, AND THEN PERFORM A TROUBLE ║
║  DIAGNOSIS AGAIN.                    ║
╚══════════════════════════════════════╝
```

= WORK CONTENT INPUT MODE =

$Z_{21}$ {
CONFIRM IMPLEMENTED ITEMS.
· REPLACEMENT OF A
  FIXING CONTROL PORTION    YES / NO
· CLEANING OF
  A FIXING ROLLER           YES / NO
    CLEANING OF A
    THERMISTOR              YES / NO
}

IF YOU HAVE ANOTHR ITEMS TO BE
IMPLIMENTED, SELECT THE ITEMS BELOW.

· PARTS REPLACEMENT

· CLEANING

· END OF WORK

FIG.10

TT TROUBLE TABLE

| CAUSE | | | | |
|---|---|---|---|---|
| DETECTIVE THERMISTOR | CONTAMINANTS IN THERMISTOR | DEFECTIVE FIXING CONTROL PORTION | MEASURE | POSSIBILITY [%] |
| 0.00 | 0.00 | 0.00 | | |
| ⋮ | ⋮ | ⋮ | | |
| 0.00 | 0.03 | 0.00 | THERMISTOR CLEANING | 100 |
| ⋮ | ⋮ | ⋮ | | |
| 0.01 | 0.02 | 0.06 | FIXING CONTROL PORTION REPLACEMENT | 80 |
| ⋮ | ⋮ | ⋮ | | |
| 0.02 | 0.02 | 0.00 | THERMISTOR EXCHANGE | 80 |
| ⋮ | ⋮ | ⋮ | | |

FREQUENCY

IMAGE FORMING APPARATUS CAPABLE OF EFFICIENT MAINTENANCE WORK

BACKGROUND OF THE INVENTION

1. Field of the Invention

The present invention relates to image forming apparatus, and particularly to maintenance work support apparatus for maintenance work by servicemen for image forming apparatus of electrophotographic system capable of communication with external devices.

2. Description of the Related Art

The electrophotographic process includes a charging process for uniformly charging a surface of a photoreceptor, an exposure process for exposing the surface of the photoreceptor according to image information to partly remove charge in order to form a latent image, a developing process for sticking toner in a developing device to the latent image to form a toner image, a transfer process for transferring the toner image to record paper (hereinafter, referred to as "paper"), and a fixing process for fixing the toner image transferred to the paper, which is widely used as a method of forming a hard copy image.

Image forming apparatus employing the electrophotographic process include a copying machine, a facsimile, and optical printers employing a laser or an LED array as light sources. These image forming apparatus usually have a CPU (Central Processing Unit) including a microprocessor and so forth, in which each portion is controlled according to a control program.

Now, conventionally, as described in Japanese Patent Laying Open No. 59-142559, for example, control systems in which each copying machine and a control unit (host) are connected to each other through a communication line in order to concentrically control a plurality of copying machines have been known.

A copying machine configuring such a control system has means for storing data corresponding to control items, in which the data is transmitted to the host according to a command from the host.

The conventional control items are mainly for grasping operational (use) conditions of the copying machines, such as the number of copies for each user and the sizes of employed paper.

That is, a conventional control system is made for an object of rational use of each copying machine, that is, enabling easy totalization of data for implementing payment of maintaining cost by beneficiaries, equality of used amount for each user and so forth, at a user side having a plurality of copying machines such as public agencies and companies.

Recently, a development of a maintenance control system is in progress in which a host provided at a service base (a service station) where servicemen are waiting and each of a plurality of image forming apparatus provided at each user are connected to each other in an on-line manner in order to implement efficient maintenance for image forming apparatus.

In the present specification, maintenance means the whole activity for maintaining operational conditions (hereinafter, referred to as "condition") of image forming apparatus normal, which includes work by servicemen at users such as periodical checking and repair of troubles (fails and bad conditions) and activities for supporting the field work, that is, activities of totalization and analysis of conditions of trouble occurrence and improvements in an operation manual and so forth.

In a maintenance control system, the control items mainly relate to conditions of image forming apparatus. The image forming apparatus is provided with a function of transmitting to a host condition data corresponding to the conditions indicated by output signals of sensors in respective parts and so forth.

By controlling conditions of each image forming apparatus at a service station, if a trouble occurs, a serviceman estimates the contents of the trouble with the condition data and visits a user with prepared necessary repairing parts, which enhances efficiency of maintenance.

In controlling the conditions, the condition data preferably shows the conditions in more detail. That is, a sensor for detecting element values of each portion in detail is preferably provided in an image forming apparatus.

Actually, however, because of some reasons such as limitation of space and cost and lack of suitable sensor means, the number of sensors and spaces for arrangement thereof are limited in an image forming apparatus, so that the contents of conditions shown by condition data have a limitation.

Accordingly, in the field work for periodical checking or trouble occurrence, a serviceman synthesizes the conditions indicated by condition data and conditions detected by the sense of the serviceman himself, selects a preventive measure or a counter measure for the trouble on the basis of the information and his own knowledge, and does his work for cleaning, parts replacement, alteration of set values and so forth in accordance with the selection.

Conventionally, however, there has been a problem that the work required a long time because, for example, it was difficult to find out a cause of a trouble, or the procedure of the measure was complicated due to fail occurrence in many portions. Especially, a serviceman having less knowledge based on experience has a difficulty in the work.

Also, a mistake might occur in finding out a cause of a trouble or in the procedure of work, which might facilitates some fails on the contrary.

On the other hand, condition data from each image forming apparatus collected and accumulated at a service station can be utilized as so-called field information (market information) in the aspect of maintenance in view of the maker side (seller side).

For example, the occurrence of troubles can be reduced by totalizing conditions of trouble occurrence on the basis of the condition data to perform periodical checking focusing on portions related to troubles with high occurrence frequency.

In accumulating such field information, the condition data preferably show conditions in more detail as is the case of the above-described condition control. That is to say, in an image forming apparatus, sensors sensing condition in each portion all over the apparatus are preferably provided.

The number of sensors and spaces for provision thereof in an image forming apparatus, however, have a limitation as described above.

Accordingly, conventionally, in maintenance control of image forming apparatus, it has been difficult to accumulate detailed information related to conditions.

SUMMARY OF THE INVENTION

It is an object of the present invention to facilitate maintenance control in an image forming apparatus.

It is another object of the present invention to enhance efficiency of maintenance control in an image forming apparatus.

It is still another object of the present invention to easily accumulate information related to maintenance control in an image forming apparatus.

It is yet another object of the present invention to speed up maintenance work by a serviceman in an image forming apparatus.

It is still another object of the percent invention to ensure maintenance work by a serviceman in an image forming apparatus.

In order to achieve above objects, a portable maintenance device according to one aspect of the present invention is a portable maintenance device connectable to each of an image forming apparatus and a central control unit for controlling the image forming apparatus, which includes receiving means for receiving condition data indicating conditions of the image forming apparatus transmitted from the image forming apparatus when connected to the image forming apparatus, storing means for storing the received condition data, and transmitting means for transmitting the condition data stored in the storing means to the central control unit when connected to the central control unit.

A portable maintenance device configured as described above receives, when it is connected to an image forming apparatus, the condition data thereof, and transmits the received condition data when it is connected to a central control unit, so that maintenance control of the image forming apparatus can be performed properly and efficiently.

In order to achieve the above objects, a control system of an image forming apparatus according to another aspect of the present invention includes image forming apparatus and a portable maintenance device. The image forming apparatus includes transmitting means for transmitting first condition data indicating conditions of the image forming apparatus to the portable maintenance device when the portable maintenance device is connected thereto. The portable maintenance device includes receiving means for receiving the first condition data from the transmitting means when connected to the image forming apparatus, operation input means for inputting second condition data indicating conditions of the image forming apparatus, storing means for storing plural pieces of guide information indicating procedures of maintenance work for the image forming apparatus, display means, selecting means for selecting at least one piece of the stored guide information on the basis of the transmitted first and the inputted second condition data, and display control means for controlling the display means so that the guide information selected by the selecting means is displayed.

In the control system of image forming apparatus configured as described above, a portable maintenance device, when it is connected to an image forming apparatus, receives the first condition data, and it can be supplied with the second data of the image forming apparatus as an input with operation, and furthermore stores the guide information showing procedures of the maintenance work, so that it enables efficient maintenance work for image forming apparatus on the basis of the information.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a diagram showing contents of communication performed by the portable maintenance device of FIG. 1.

FIGS. 9A, 9B and 9C are diagrams showing examples of a displayed screen of the display of FIG. 2.

FIG. 10 is a diagram showing contents of a trouble table stored in the portable maintenance device of FIG. 1.

DESCRIPTION OF THE PREFERRED EMBODIMENTS

Embodiments of the present invention will be described below referring to the figures.

Figure 3:
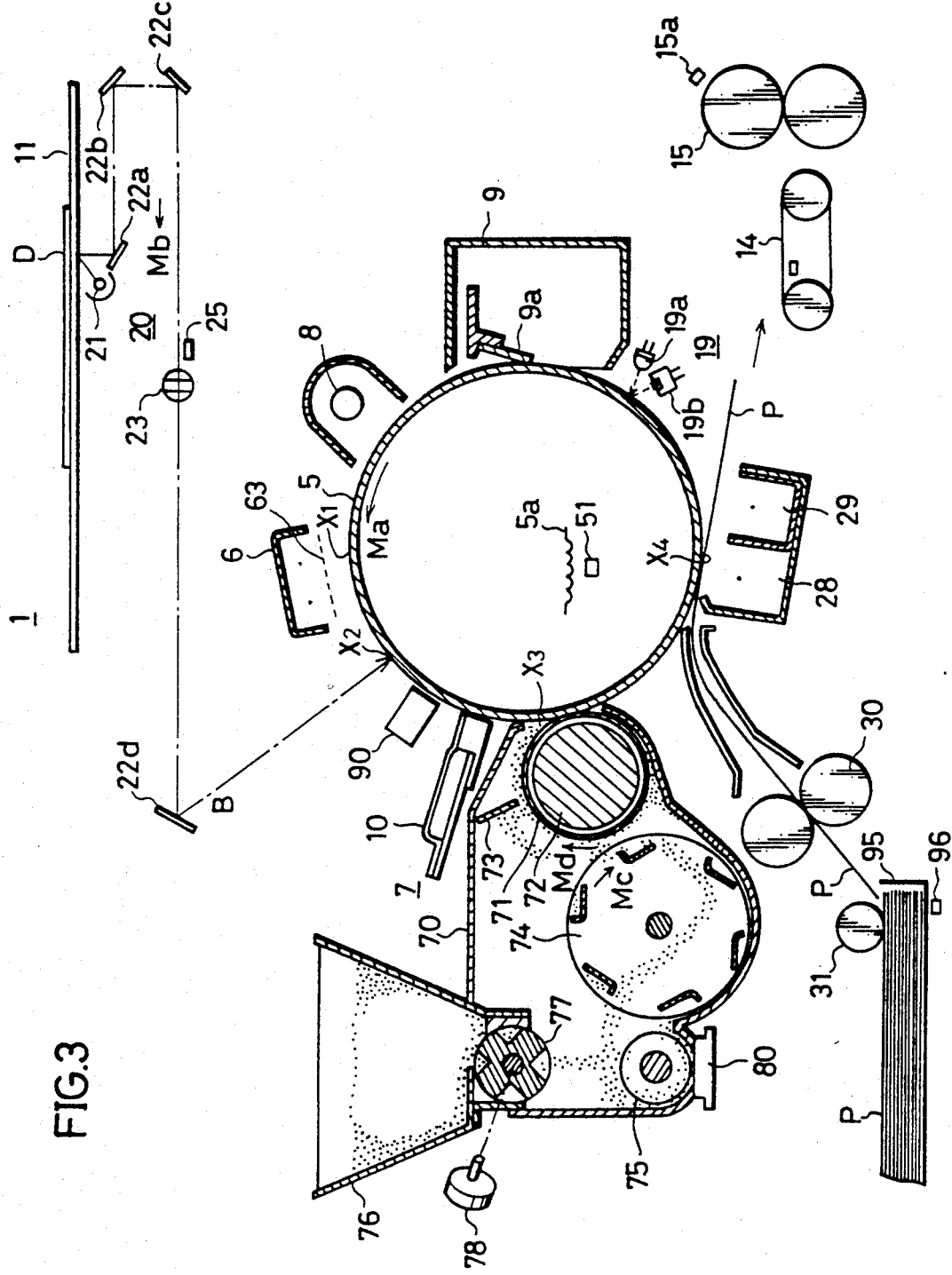
FIG. 3 is a front sectional view showing a main portion of a copying machine according to one embodiment of the present invention.

FIG. 3 is a front sectional view showing a main portion of a copying machine 1.

In the figure, a photoreceptor drum 5 is arranged rotatably at a constant circumferential speed v in the direction of the arrow Ma. A heater 5a for heating photoreceptor drum 5 and a temperature sensor 51 are provided therein. On/off control of heater 5a is performed on the basis of an output signal of temperature sensor 51, and the temperature of photoreceptor drum 5 is kept constant thereby.

Around photoreceptor drum 5, for the electrophotographic process, a corona charger 6, an eraser 10 for portions between images, a developing device 7, a transfer charger 28, a copy paper separation charger 29, a cleaning device 9, and a main eraser 8 are provided. Corona charger 6 is a charger of Scorotron type having a mesh-like grid 63.

Between an exposure position X2 and the eraser 10, a surface electrometer (VO sensor) 90 for measuring a surface potential (VO) of the photoreceptor drum 5 is provided. Also, between the separation charger 29 and the cleaning device 9, a reflection type photosensor (AIDC sensor 19 including an emitter element 19a and a receiving element 19b is provided for measuring the density of a reference toner image.

The surface of photoreceptor drum 5, passing under the corona charger 6, is evenly charged and exposed by an optical system 20 at the exposure position X2. By the exposure, the surface charge of photoreceptor drum 5 is partly removed and a latent image corresponding to an original D is formed on the surface of photoreceptor drum 5. The surface charge except the potion of the latent image is erased by eraser 10.

Optical system 20 includes an exposure lamp 21 irradiating the original D located on a platen glass 11, mirrors 22a–d for guiding the reflected light B from the original D to the exposure position X2, and a projecting lens 23. In the vicinity of the projecting lens 23, an AE sensor 25 sensing the amount of the reflected light from the original D is provided.

In exposure-scanning to the original D, exposure lamp 21 and mirror 22a move at a speed of v/m (m indicates a copying magnification) in the direction designated by the arrow Mb, and mirrors 22b, 22c are movable at a speed of v/2m.

The latent image formed on the surface of photoreceptor drum 5 is developed by developing device 7 to appear as a toner image.

The developing device 7 performs so-called non-reversal development, in which a developer composed of a mixture of magnetic carrier and insulative toner is employed, and the toner sticks to a latent image (a charge existing portion, or non-exposed portion) passing through a developing position X3 by the well known magnetic brush system. In a developer tank 70, there are a developing sleeve 71 having a magnetic roller 72 therein, a regulating plate 73, a bucket roller 74, and a screw roller 75, and a toner concentration sensor (ATDC sensor) 80 is provided below the screw roller 75.

When the bucket roller 74 rotates in the direction designated by the arrow Mc, the developer sticks to the outer peripheral surface of the developing sleeve 71 because of the magnetic power of magnetic roller 72, which is transported to the developing position X3 with the rotation of the developing sleeve 71 in the direction of the arrow Md. The toner concentration sensor 80 measures the weight percentage T/C [wt%] of the toner with respect to the entire developer based on the permeability of the developer.

A toner tank 76 is provided above developing tank 70 and a toner supply roller 77 is provided in the bottom portion thereof. With the toner supply roller 77 rotation-driven by a supply motor 78, the toner is supplied from toner tank 76 to screw roller 75. The supplied toner is stirred and mixed with the developer already existing inside the developing tank 70 with the rotation of screw roller 75 to be sent to bucket roller 74. Frictional electrification is produced in the stirring and mixing, so that the magnetic carrier and the toner are charged in different polarities. The toner of negative polarity sticks to the surface of photoreceptor drum 5 at the developing position X3 because of electrostatic adsorption with the surface charge of photoreceptor drum 5. Then, in order to prevent the toner from sticking because of the residual charge (charge remaining in the exposed portion) on the surface of photoreceptor drum, developing bias VB of a predetermined voltage is applied to developing sleeve 71.

On the other hand, paper P are fed one by one by a paper feed roller 31 from a detachable paper feed cassette 95, which are transported while keeping timing with rotation of photoreceptor drum 5 by a timing roller 30 to a transfer position X4 where a toner image is transferred to the paper P by transfer charger 28. The paper P to which the toner image is transferred is separated from photoreceptor drum 5 by copy paper separation charger 29, sent to fixing device 15 by a transporting belt 14, and discharged out of copying machine 1 after heat-fixing of the toner image. The fixing temperature of fixing device 15 is sensed by temperature sensor 15a.

Subsequently, on the surface of photoreceptor drum 5, the remaining toner is removed by a cleaning blade 9a of cleaning device 9 and residual charge is removed by main eraser 8 for the next exposure. The light amount of main eraser 8 is controlled constant on the basis of an output of a light amount sensor (not shown).

A paper sensor 96 including a photo sensor sensing presence/absence of paper P is provided in paper feed cassette 95.

Figure 4:
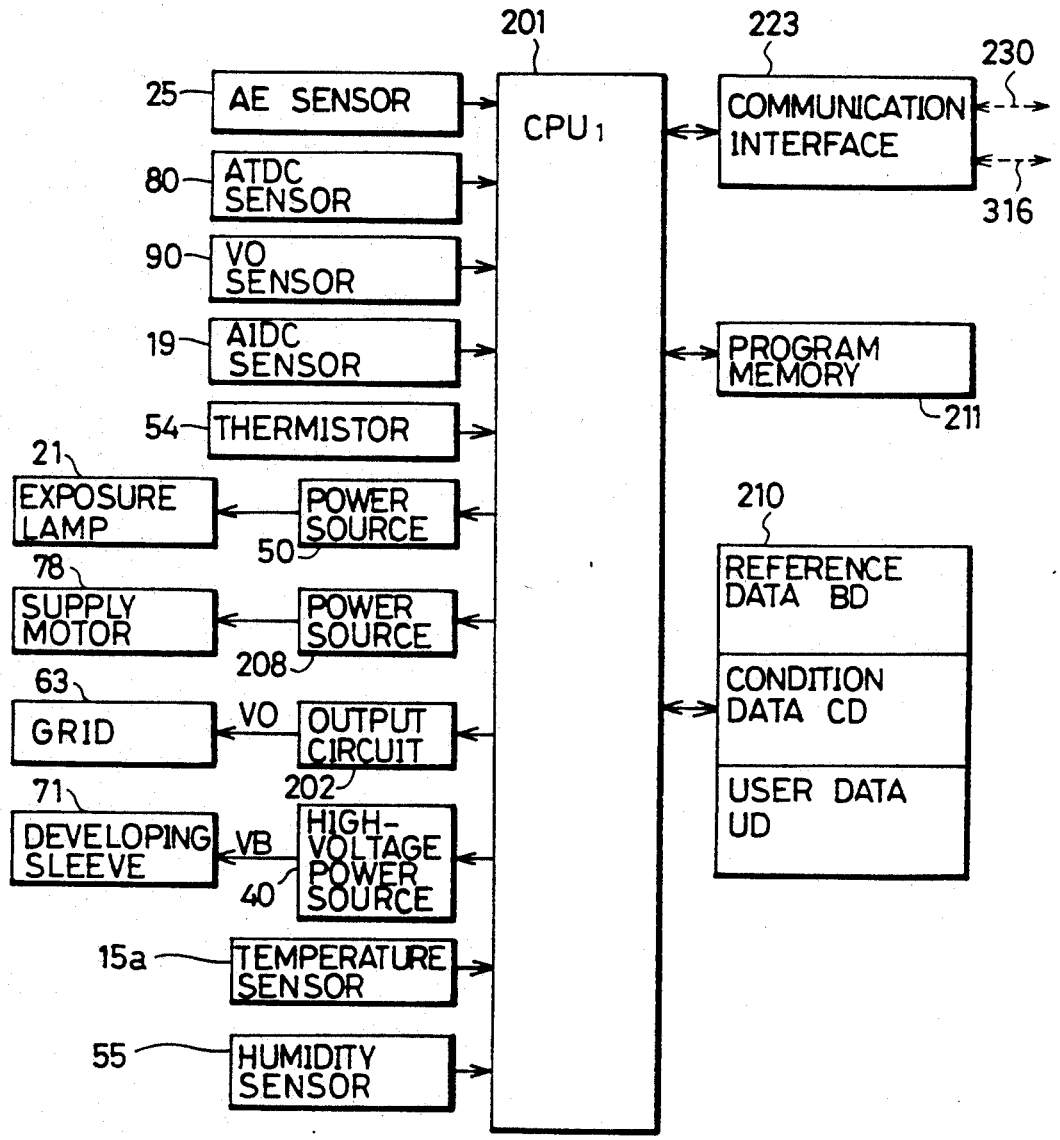
FIG. 4 is a block diagram of a control circuit of the copying machine of FIG. 3.

FIG. 4 is a block diagram of a control circuit 200 of copying machine 1.

Control circuit 200 includes a CPU 201 totally controlling copying machine 1, a program memory 211 storing a control program, a memory 210 storing various kinds of data used for controlling the electrophotographic process, copying machine 1 and so forth, a communication interface 223 for communicating with external devices such as a control unit 2 or a portable maintenance device 3 which will be described later, and so forth.

The CPU 201 is supplied with signals from sensors such as the above-described AE sensor 25, ATDC sensor 80, VO sensor 90, AIDC sensor 19, a temperature sensor 15a sensing temperature of fixing device 15, a thermistor 54 for detecting installation circumstances of copying machine 1, humidity sensor 55 and so forth. Exposure lamp power source 50 for lighting exposure lamp 21, power source 208 for driving supply motor 78, output circuit 202 for setting surface potential V0 of photoreceptor drum 5, high-voltage power source 40 for applying developing bias VB and so forth are supplied with control signals from CPU 201.

CPU 201 controls communication of transmitting the data in memory 210 to external devices according to commands from the external devices in addition to controlling the electrophotographic process.

The data stored in memory 210 include reference data BD which is a reference for controlling the electrophotographic process, condition data CD indicating the past and present conditions including information of set values in each portion appropriately changed in control, such as the light amount of exposure lamp 21, the voltage applied to grid 63, and the bias voltage applied to the developing sleeve, of installation circumstances such as temperature and humidity, and information such as the surface potential (Vo) of the photoreceptor, the image density measured by AIDC sensor 19 and temperature of fixing device 15, and user data UD related to operation control of a user such as management of the number of copies and consumable goods.

Figure 5:
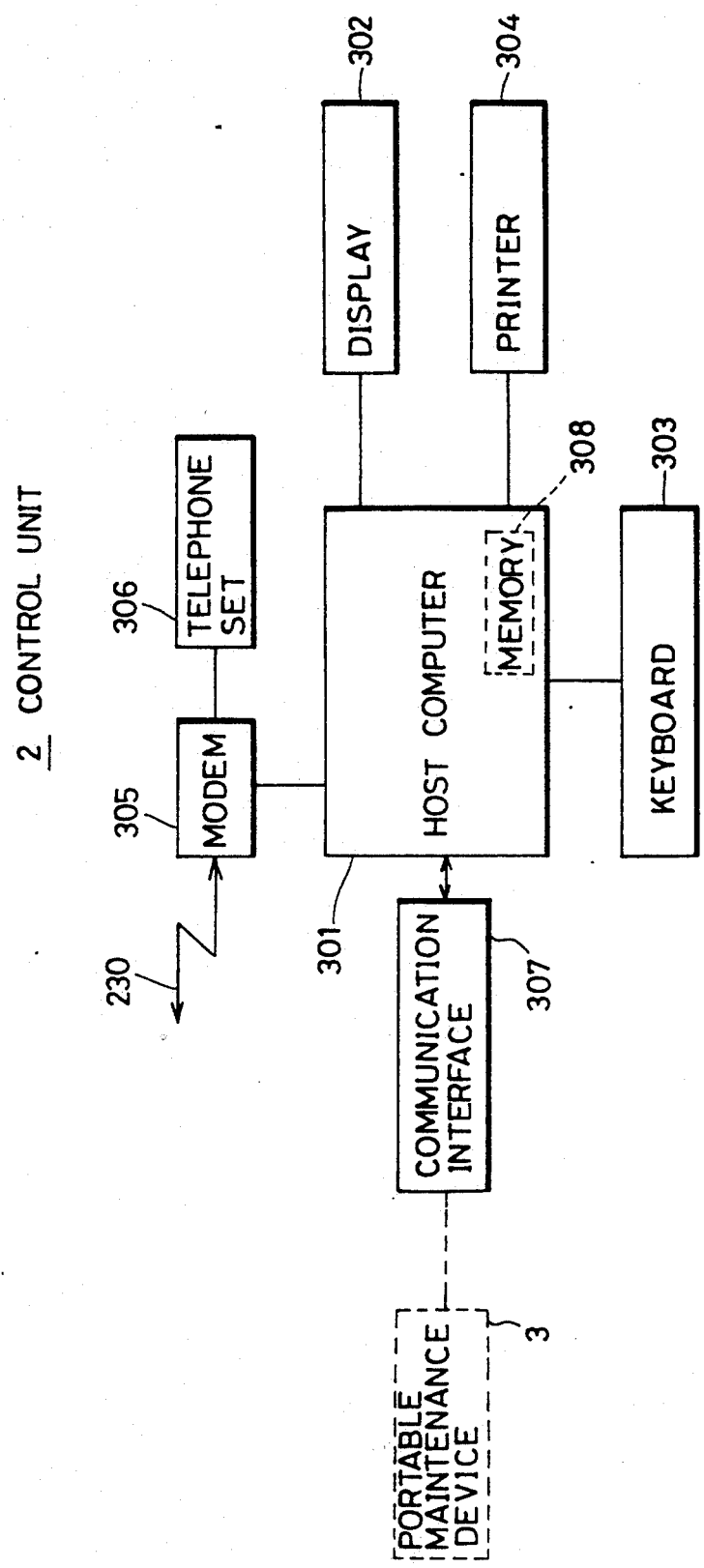
FIG. 5 is a block diagram of a control unit of a service station according to one embodiment of the present invention.

FIG. 5 is a block diagram showing a configuration of a control unit 2 at the service station.

The control unit 2 includes a host computer 301 carrying out various kinds of processes according to the software, a display 302 for displaying, a keyboard 303 as operation input means, a printer 304 for printing, a modem 305 for communication with a plurality of copying machines provided at respective users through a telephone line 230, and a telephone set 306 for communication between a serviceman and a user.

The host computer 301 of the present embodiment is capable of data exchange with potable maintenance device 3 which is carried by a serviceman in the service visit and includes a communication interface 307 for communication with portable maintenance device 3 and a memory 308 for storing the field information FD including information of use conditions and fail occurrence portions of the copying machine 1 supplied by the portable maintenance device.

Figure 1:
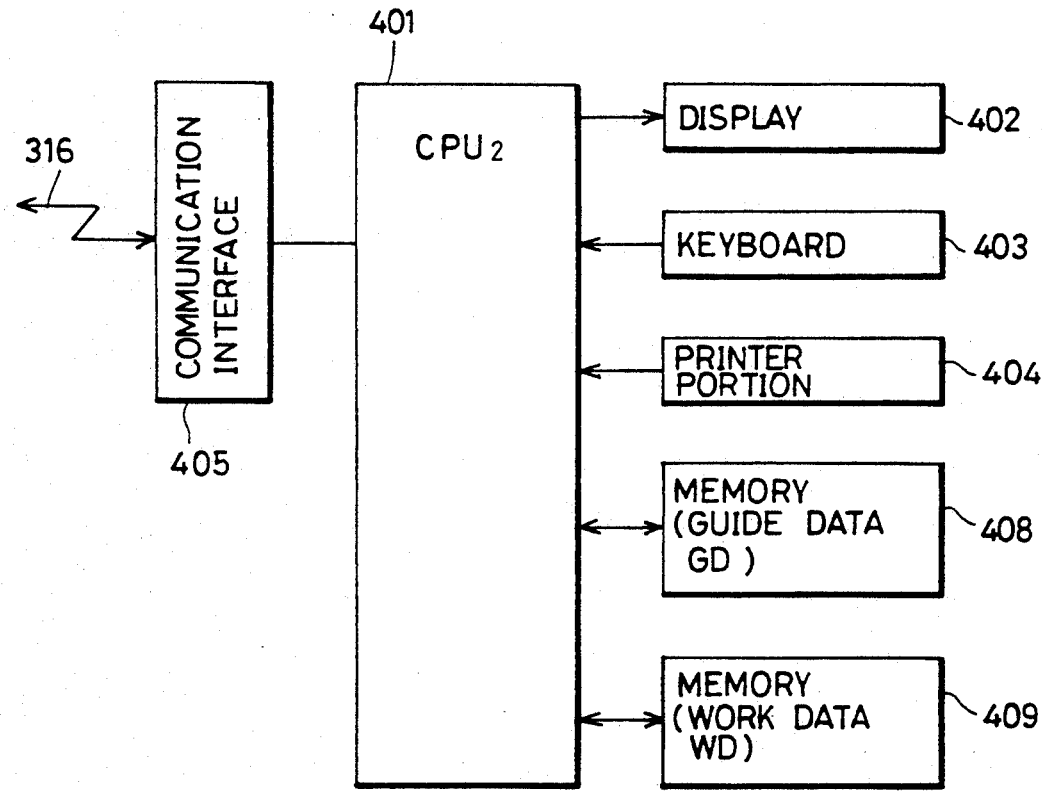
FIG. 1 is a block diagram showing a configuration of a portable maintenance device according to one embodiment of the present invention.
Figure 2:
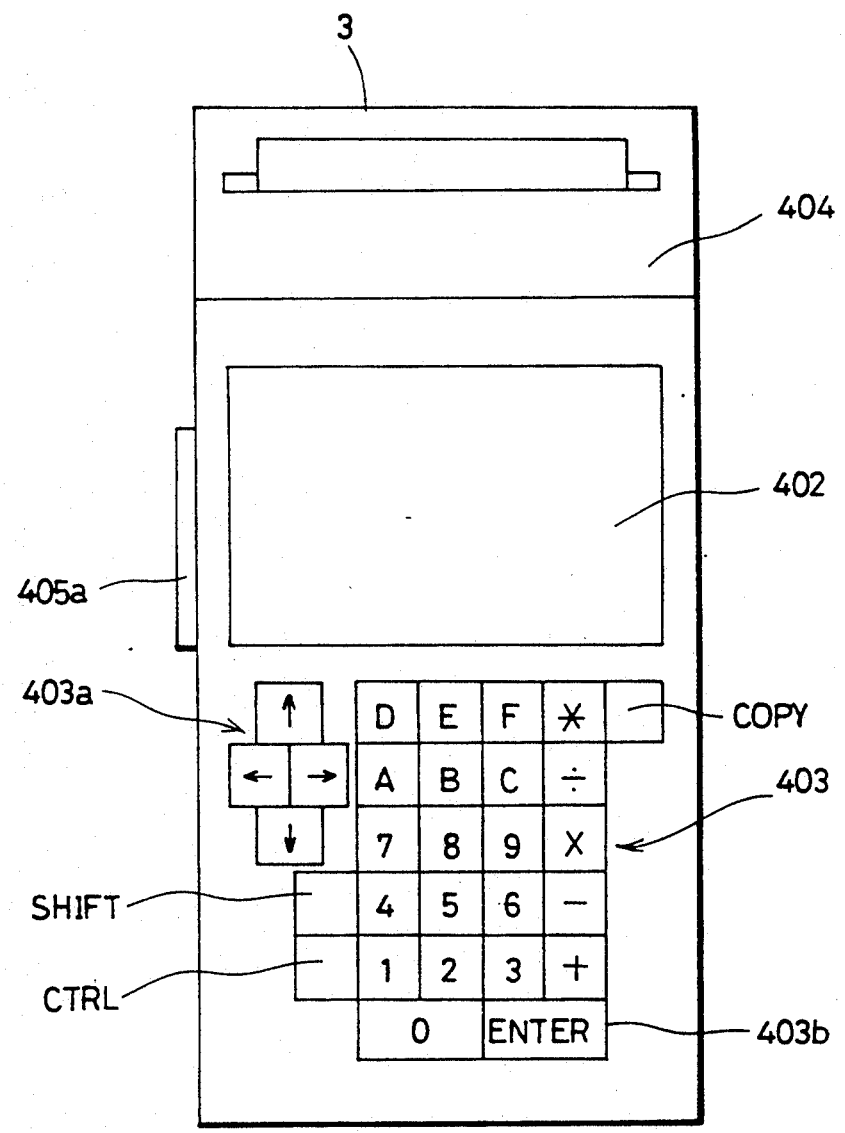
FIG. 2 is a front view showing an external appearance of the portable maintenance device of FIG. 1.

FIG. 1 is a block diagram showing a configuration of portable maintenance device 3, and FIG. 2 is a front view showing external appearance of portable maintenance device 3.

The portable maintenance device 3 includes a display 402 for guidance display and so forth, a group of keys 403 including various kinds of keys for operation input, a printer portion 404, a communication interface 405 for communication with copying machine 1 or host computer 301 through a cable 316, a memory 408 for storing guide data GD supporting field work, a memory 409 capable of reading/writing of the work data WD indicating contents of the field work by a serviceman, and a CPU 401 for controlling them. The operation keys arranged in the group of keys 403 include keys corresponding to numerals of 0 to 9 and alphabets of A to F, keys for the four rules of arithmetic, cursor keys 403a for moving a cursor in up, down, left and right directions on the screen of display 402, and an enter (ENTER) key 403b for starting processings.

In FIG. 2, the numeral character 405a indicates a connector for connecting cable 316.

A portable maintenance device 3 configured as described above is a component of a maintenance control system of copying machine 1, which works as an information transmitting medium connecting copying machine 1 and control unit 2 in an off-line manner and as support means for field work by a serviceman.

That is to say, the portable maintenance device 3 has an information transmission function of storing the information transmitted from copying machine 1 and information supplied by a serviceman and transmitting the same to control unit 2, and a trouble diagnosis and automatic adjusting function of displaying a guidance display instructing the work procedure on the basis of the guide data GD and transmitting a command signal for varying a set value in each portion of copying machine 1 as needed.

FIG. 6 is a diagram showing contents of the communication by potable maintenance device 3.

A serviceman connects portable maintenance device 3 and host computer 301 first at a service station in order to give the newest guide data GD to portable maintenance device 3 when he is making a visit to a user for periodical checking or for dealing with a trouble. The guide data GD is updated in order on the basis of the field information FD by control unit 2.

The serviceman arriving at a user connects the potable maintenance device 3 to copying machine 1 in order to have the condition data CD indicating conditions transmitted from memory 210 of copying machine 1 to potable maintenance device 3. The serviceman also inputs the information about conditions detected with the sense by the serviceman himself into portable maintenance device 3 as complementary condition data HCD.

The portable maintenance device 3 totally examines the condition data CD, the complementary condition data HCD, and the guide data GD to make a guidance display of the most appropriate work procedure corresponding to the conditions.

The serviceman can proceed his work properly and quickly following the guidance display.

At the end of the work, the serviceman inputs in the portable maintenance device 3 information indicating items actually performed in the work (implemented items), such as adjusted portions, cleaned portions, and replaced parts, together with a machine number specifying the copying machine 1, a name of the serviceman and so forth. The supplied information is stored in memory 409 as the work data WD indicating contents of the work together with the condition data CD, the complementary condition data HCD, and contents of the guidance display (diagnosis result).

The serviceman can also read a copied image using an image reader in order to have the image data stored in portable maintenance device 3 as a part of the complementary condition data HCD.

The serviceman, returning to the service station, connects portable maintenance device 3 and host computer 301 again, and performs operation for have the work data WD transmitted to control unit 2.

The work data WD transmitted in this way is utilized as field information FD for production of guide data GD together with work data WD corresponding to each of a large number of copying machines 1 similarly collected. In producing the guide data GD, the work data WD can be taken in as external events for trouble diagnosis in the field of the artificial intelligence to be employed for estimating a cause of a trouble.

Next, the field work using potable maintenance device 3 in occurrence of a trouble related to fixing device 15 will be described as a specific example.

Figure 7A:
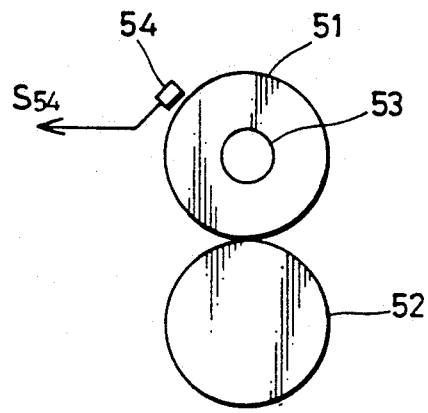
FIGS. 7A and 7B are diagrams showing configuration of the fixing device shown in FIG. 3.
Figure 7B:
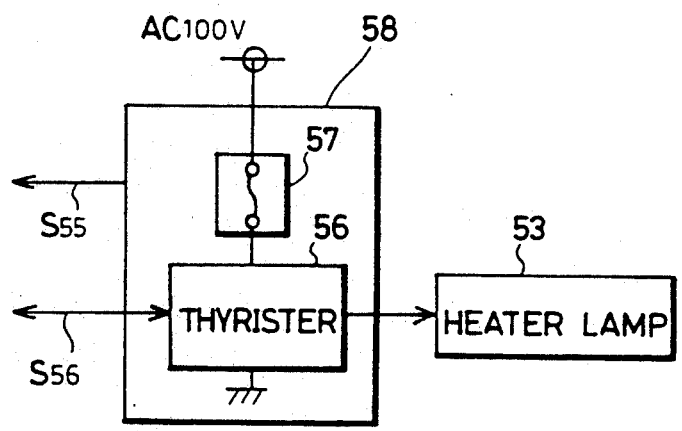

FIGS. 7A and 7B are diagrams showing configuration of fixing device 15.

Fixing device 15 includes a heating roller 51 having a heater lamp 53 provided therein, a pressure roller 52 for pressuring paper P, a thermistor 54 sensing a surface temperature of heating roller 51, and fixing control portion 55. Fixing control portion 55 includes a thyristor 56 as a switching element and a braker 57 packaged to a substrate 58.

An output signal S54 of thermistor 54 is supplied to CPU 201, which provides a control signal S56 to thyristor 56 in response to the signal S54. Thus, supply of alternating current power to heater lamp 53 is controlled to keep heating roller 51 at a predetermined temperature.

Braker 57 is a safety device of non-return type cutting the power supply to heater lamp 53 when the circumferential temperature of heating roller 51 becomes abnormally high. A sensor (not shown) is provided in a supporting portion of fixing control portion 55, so that a sense signal S55 indicating replacement of fixing control portion 55 is supplied to CPU 201 when the fixing control portion 55 is taken out of copying machine 1.

Figure 8:
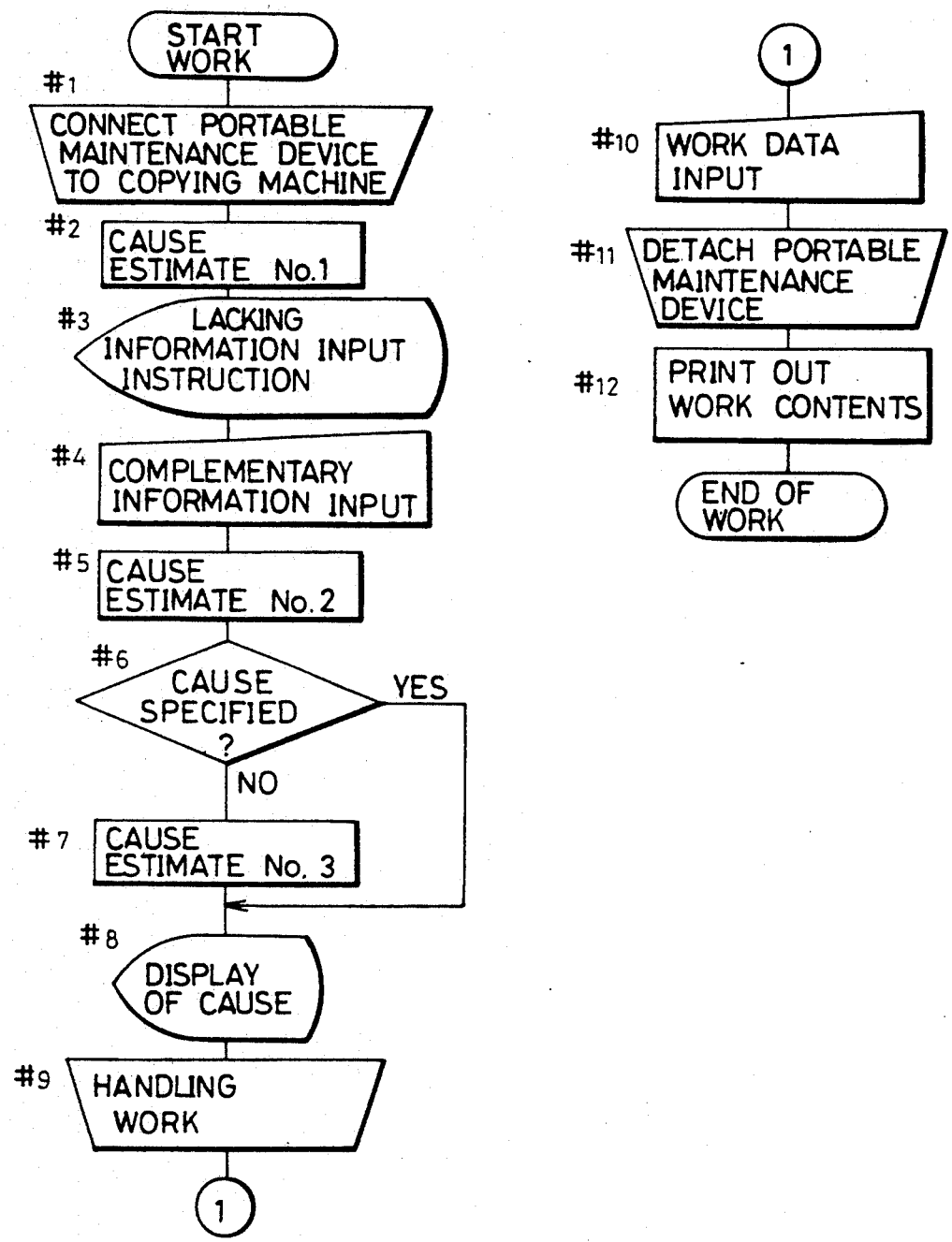
FIG. 8 is a flow chart diagram showing field work by a serviceman according to one embodiment of the present invention.

FIG. 8 is a flow chart diagram showing the field work by a serviceman, and FIGS. 9A–9C are diagrams showing examples of displayed screens of display 402.

In the example of FIG. 8, the situation of the trouble is that a so-called wait for waiting for the temperature of heating roller 51 to reach a predetermined value before starting image forming is not eliminated (wait up) after a predetermined timed period.

A serviceman visiting a user side first connects his portable maintenance device 3 to copying machine 1 (step #1). As described-above, the newest guide data GD is already stored in portable maintenance device 3 at a service station.

Upon selection of a trouble diagnosis mode with key 403 by the serviceman, the portable maintenance device 3 reads the condition data CD from copying machine 1 to carry out an estimate No. 1 of a portion in which a fail is occurring, or of a cause of the trouble, on the basis of the conditions designated by the condition data CD (step #2).

In this stage, a message Z1 corresponding to the condition is displayed in display 402 as shown in FIG. 9A.

The message Z1 indicates that the sensed temperature by thermistor 54 is not more than 135° C. which is not abnormally high.

Causes of the trouble estimated only based on the information that the sensed temperature by thermistor 54 is at the above value include a large number of items.

That is, in this case, a defect of thermistor 54, contaminants of thermistor 54, damage of heater lamp 53, a defect of fixing control portion 55, inferior mounting (inferior contact) of fixing control portion 55 and so forth can be pointed out as causes of the trouble.

Next, portable maintenance device 3 displays messages Z2, Z3 demanding a serviceman for input of complementary information necessary for specifying a cause of the trouble (step #3).

The serviceman inputs the information which he obtained with visual confirmation or the like as complementary condition data HCD into portable maintenance device 3 according to the displayed contents (step #4). In the example of FIG. 9A, a question is made as to whether braker 57 is ON or not as a message Z3, and an input corresponding to the same is made by selection of YES or NO.

After this, in an interaction system in which the next message is displayed according to an input corresponding to the previous message, the display of the messages Z4, Z5 and inputs corresponding to the displays are sequentially made.

When the information obtained with the sense of the serviceman is supplied, portable maintenance device 3 performs trouble cause estimate No. 2 also referring to the information newly inputted (step #5). Then, a message Z6 indicating it is now being estimated is displayed in display 402.

When a cause of the trouble is specified, that is, if the number of items estimated as a cause with a predetermined accuracy can be narrowed down to one or two (step #6), it proceeds to step #8 to display the cause.

For example, if heater lamp 53 lights and an output of thermistor 54 varies even just a little bit according to the lightening, a cause of the trouble can be specified as contaminants of thermistor 54, so that a display for instructing cleaning of thermistor 54 is made in step #8.

If braker 57 is cut-off, however, or when the power supply is shielded, the cause of the trouble can not be specified. In this case, the cause estimate No. 3 is performed on the basis of a trouble table TT indicating handling methods corresponding to conditions of the past trouble occurrence in the market included in the guide data GD (step #7).

FIG. 10 is a diagram showing contents of the trouble table TT.

The trouble table TT includes information of occurrence frequency for each item pointed out as a cause of a trouble, handling methods corresponding to each item and possibility that each item is a real cause. In the example of FIG. 10, if the occurrence frequency of troubles caused by a defective thermistor, contaminants of a thermistor and a a thermistor and a defecte in fixing control portion 55 are 1%, 2% and 6%, respectively, since the occurrence frequency of a defecte of fixing control portion 55 is high as compared to the occurrence frequencies of troubles caused by a defect or contaminants of thermistor 54 which are pointed out as causes of the present trouble, the cause of the present trouble can be specified as a defect of fixing control portion 55. In this case, however, it is specified only with a statistical estimate.

Accordingly, if a cause is estimated on the basis of the trouble table TT, it is displayed that the cause is specified with not high accuracy in display 402 as shown in FIG. 9B, and an instruction of work to be performed is also displayed, accordingly.

The serviceman works on the basis of display in display 402 (step #9), and after confirmation of repair of the trouble at the end of the work, the serviceman operates the keys for storing the work data WD into portable maintenance device 3 (step #10).

If the serviceman selects a work content input mode, the message Z21 is displayed for confirmation as to whether the implemented items estimated according to the above fail diagnosis have been actually practiced or not in display 402 as shown in FIG. 9C.

The serviceman performs selecting operation of YES or NO employing cursor keys 403a and an enter key 403b with respect to the displayed each practice item.

If YES is selected, the implemented item is stored in memory 409 as the work data WD indicating a part of the work contents.

In this way, input of work contents is performed in a confirmation operation system, so that the operation is easier than the method in which predetermined codes for respective implemented items are sequentially supplied, with the result that mistakes and oversights are not made in input.

Also, a message Z22 instructing input of implemented items according to decision by the serviceman himself is displayed in display 402. In the example of FIG. 9C, selection of large items of "parts replacement", "cleaning" and "end of work" are instructed. If "parts replacement" or "cleaning" is selected, the display switches to a corresponding one. If there is no item to be inputted, end of work is selected.

With respect to a part of which loading/unloading is reported to CPU 201, such as fixing control portion 55, the data indicating parts replacement is automatically supplied as work data WD from copying machine 1 to portable maintenance device 3 when it is replaced.

Returning to FIG. 8, upon completion of input of work contents, the serviceman detaches the portable maintenance device 3 from copying machine 1 (step #11). During this time, portable maintenance device 3 counts a connection time with copying machine 1 through cable 316 and automatically stores the connection time as a work time into memory 409.

Subsequently, the serviceman prints out the work data WD as a list showing work contents using print portion 404 as needed.

If the guide data GD includes data necessary for calculating a work charge, the serviceman issues a bill of the working charge employing portable maintenance device 3 and hands it to the user.

Figure 11:
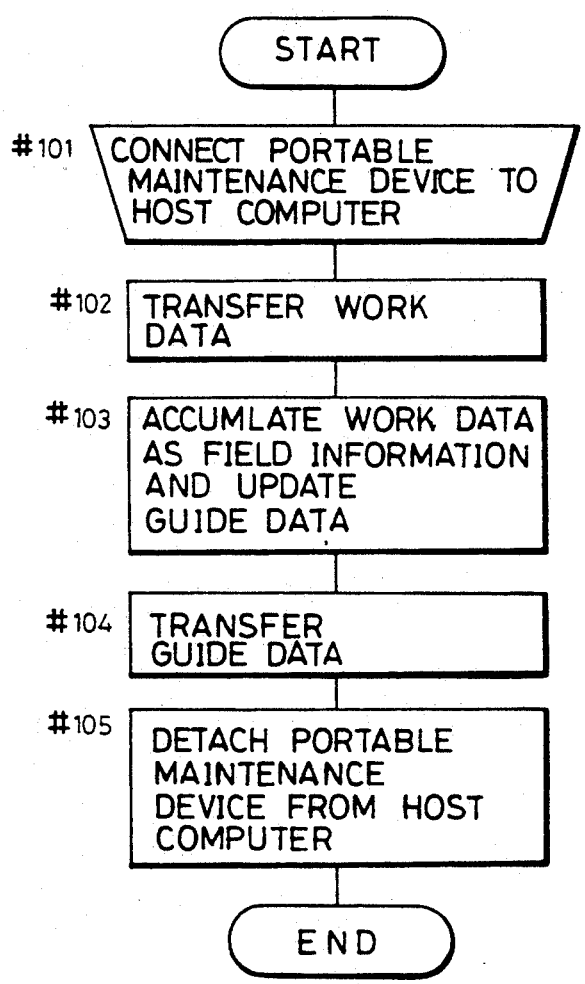
FIG. 11 is a flow chart diagram showing updating of corresponding data stored in the portable maintenance device of FIG. 1.

FIG. 11 is a flow chart diagram showing updating of the guide data GD.

The serviceman connects a portable maintenance device 3 to host computer 301 at a service station (step #101).

The work data WD is transmitted from portable maintenance device 3 to control unit 2 (step #102).

In control unit 2, the work data WD is stored as the field information, and the guide data GD is updated on the basis of the newest field information FD (step #103).

The updated guide data GD is transmitted to portable maintenance device 3 (step #104).

In portable maintenance device 3, the existing guide data GD stored in memory 408 is rewritten to the newest guide data GD newly transmitted.

Thus, the serviceman is supported by the newest guide data GD, which makes the field work more quick and appropriate.

Subsequently, portable maintenance device 3 is detached from host computer 301 for preparation of the next field work (step #105).

According to the above-described embodiments, portable maintenance device 3 is configured to store the condition data CD transmitted from copying machine 1 together with other information such as complementary condition data HCD and transmit the same to control unit 2. Accordingly, even if an on-line connection is not made between copying machine 1 and control unit 2, the condition of copying machine 1 can be controlled in control unit 2. Accordingly, a copying machine 1 of small size or low price provided with no modem for transmitting data employing a telephone line can be an object to be controlled in the maintenance control system.

According to the above-described embodiment, the serviceman can proceed his work according to the display of display 402, so that even a serviceman with less experience of the field work can properly find out a cause of a trouble to quickly repair the copying machine 1 into a normal condition.

According to the present invention, in the field work by a serviceman, treatments corresponding to the operational conditions of an image forming apparatus are made more suitable, and also the serviceman can proceed his work quickly.

Also, according to the present invention, in addition to the above-described effects, the serviceman can proceed the field work on the basis of improved guide information, so that the suitability and quickness of the field work can be further enhanced.

Furthermore, according to the present invention, detailed information with respect to conditions necessary in maintenance control of image forming apparatus can be easily accumulated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A portable maintenance device connectable to each of an image forming apparatus and a central control unit for controlling said image forming apparatus, comprising:

receiving means for receiving condition data indicating conditions of said image forming apparatus transmitted from said image forming apparatus when connected to said image forming apparatus and disconnected from said central control unit;

storing means for storing said received condition data; and transmitting means for transmitting the condition data stored in said storing means to said central controlling unit when connected to said central control unit and disconnected from said image forming apparatus.

2. The portable maintenance device according to claim 1, further comprising:

operation input means for inputting maintenance data about maintenance of said image forming apparatus; wherein said storing means stores said inputted maintenance data together with the condition data, and said transmitting means transmits the maintenance data stored in said storing means to said control unit together with the condition data.

3. A system comprising:

an image forming apparatus for forming an image on paper;

a central control unit for controlling said image forming apparatus; and a portable maintenance device connectable to each of said image forming apparatus and said central control unit; wherein said image forming apparatus comprises first transmitting means for transmitting condition data indicating conditions of the image forming apparatus to said portable maintenance device when said portable maintenance device is connected thereto;

said portable maintenance device comprises first receiving means for receiving the condition data from said first transmitting means when connected to said image forming apparatus and disconnected from said central control unit, storing means for storing said received condition data, and second transmitting means for transmitting the condition data stored in said storing means to said central control unit when connected to said central control unit and disconnected from said image forming apparatus; and said central control unit comprises second receiving means for receiving the condition data from said second transmitting means.

4. The system according to claim 3, wherein said portable maintenance device further comprises operation input means for inputting maintenance data about maintenance of said image forming apparatus, said storing means storing said inputted maintenance data together with the condition data, and said second transmitting means transmitting the maintenance data stored in said storing means together with the condition data to said central control unit.

5. The system according to claim 4, wherein said maintenance data includes data indicating a type of maintenance work performed on said image forming apparatus.

6. The system according to claim 3, wherein said image forming apparatus further comprises:

a photoreceptor, a charger for charging a surface of said photoreceptor, exposure means for irradiating light corresponding to an original image to said charged photoreceptor to form an electrostatic latent image, developing means for developing said formed electrostatic latent image with toner, transfer means for transferring the toner image formed by said developing means on paper, and fixing means for fixing said transferred toner image with heat on the paper.

7. The system according to claim 6, wherein said image forming apparatus further comprises means for adjusting an amount of light irradiated by said exposure means, said stored condition data including light amount data corresponding to said light amount.

8. The system according to claim 6, wherein said image forming apparatus further comprises means for adjusting a voltage applied to said charger, said stored condition data including voltage data corresponding to said voltage.

9. The system according to claim 6, wherein said image forming apparatus further comprises means for adjusting a bias voltage applied to said developing means, said stored condition data including bias voltage data corresponding to said bias voltage.

10. The system according to claim 6, wherein said image forming apparatus further comprises a potential sensor for sensing a surface potential of said photoreceptor, said stored condition data including potential information sensed by said potential sensor.

11. The system according to claim 6, wherein said image forming apparatus further comprises a density sensor for sensing image density of the toner image formed on the surface of said photoreceptor, said stored condition data including density information sensed by said density sensor.

12. The system according to claim 6, wherein said image forming apparatus further comprises a temperature sensor for sensing temperature of said fixing means, said stored condition data including temperature information sensed by said temperature sensor.

13. A control system of an image forming apparatus, comprising:

a portable maintenance device connectable to said image forming apparatus; wherein said image forming apparatus comprises transmitting means for transmitting first condition data indicating condition of the image forming apparatus to said portable maintenance device when said portable maintenance device is connected thereto, and said portable maintenance device comprises, receiving means for receiving the first condition data from said transmitting means when connected to said image forming apparatus and disconnected from a central control unit, storing means for storing guide information indicating a procedure of maintenance work for said image forming apparatus, character display means, and display control means for controlling said character display means so that said stored guide information is displayed on the basis of said received first condition.

14. The control system according to claim 13, further comprising a central control unit for controlling said image forming apparatus, wherein said portable maintenance device is also connectable to said central control unit, said central control unit has means for transmitting a signal for changing the guide information stored in said storing means when said portable maintenance device is connected thereto, and said portable maintenance device has means for changing said guide information on the basis of said transmitted signal.

15. The control system according to claim 13, wherein said portable maintenance device further comprises operation input means for inputting second condition data indicating conditions of said image forming apparatus, said guide information includes first information indicating an operation procedure of said operation input means and second information indicating a fail portion of said image forming apparatus, and said display control means controls said character display means so that said first information is displayed on the basis of the first condition data received by said receiving means and also controls said character display means so that said second information is displayed on the basis of the second condition data inputted with operation of said operation input means.

16. A control system of an image forming apparatus, comprising:

a portable maintenance device connectable to said image forming apparatus; wherein said image forming apparatus comprises transmitting means for transmitting first condition data indicating conditions of the image forming apparatus to said portable maintenance device when said portable maintenance device is connected thereto, and said portable maintenance device comprises, receiving means for receiving the first condition data from said transmitting means when connected with said image forming apparatus and disconnected from a central control unit, operation input means for inputting the second condition data indicating conditions of said image forming apparatus, storing means for storing plural pieces of guide information indicating procedures of maintenance work for said image forming apparatus, display means, selecting means for selecting at least one piece of said stored guide information on the basis of said transmitted first and said inputted second condition data, and display control means for controlling said display means so that the guide information selected by said selecting means is displayed.

17. A portable maintenance device connectable to an image forming apparatus, comprising:

receiving means for receiving first condition data indicating conditions of said image forming apparatus transmitted from said image forming apparatus when connected to said image forming apparatus and disconnected from a central control unit;

storing means for storing guide information indicating a procedure of maintenance work for said image forming apparatus;

character display means; and display control means for controlling said character display means to display said stored guide information on the basis of said received first condition data.

18. The portable maintenance device according to claim 17, further comprising:

operation input means for inputting second condition data indicating conditions of said image forming apparatus; wherein said guide information comprises first information indicating operation procedure of said operation input means and second information indicating a fail portion of said image forming apparatus, and said display control means controls said character display means so that said first information is displayed on the basis of the first condition data received by said receiving means and also controls said character display means so that said second information is displayed on the basis of the second condition data inputted with operation of said operation input means.

19. The portable maintenance device according to claim 17, which is also connectable to a central control unit for controlling said image forming apparatus, and further comprises means for varying said stored guide information on the basis of a signal transmitted from said central control unit when connected to said central control unit.

20. A system comprising:
an image forming apparatus;
a central control unit for controlling said image forming apparatus; and
a portable maintenance device connectable to each of said image forming apparatus and said central control unit; wherein
said image forming apparatus comprises first transmitting means for transmitting first condition data indicating conditions of the image forming apparatus to said portable maintenance device when said portable maintenance device is connected thereto;
said portable maintenance device comprises,
first receiving means for receiving said first condition data transmitted from said first transmitting means when connected to said image forming apparatus,
operation input means for inputting second condition data indicating conditions of said image forming apparatus,
storing means for storing said received first and said inputted second condition data,
storing means for storing plural pieces of guide information indicating procedures of maintenance work for said image forming apparatus,
display means,
selecting means for selecting at least one piece of said stored guide information on the basis of said stored first and second condition data,
display control means for controlling said display means to display the guide information selected by said selecting means, and
second transmitting means for transmitting the first and second condition data stored in said storing means to said central control unit when connected with said central control unit,
said central control unit comprises,
second receiving means for receiving the first and second condition data from said second transmitting means, and
third transmitting means for transmitting a signal for varying the guide information stored in said storing means to said portable maintenance device when said portable maintenance device is connected thereto, and
said portable maintenance device further comprises third receiving means for receiving said transmitted signal and guide information varying means for varying the guide information stored in said storing means on the basis of said received signal.

21. A control system of an image forming apparatus having image forming means for forming an image on paper, comprising:
a central control unit; and
a portable maintenance device; wherein
said portable maintenance device is connectable to said central control unit, and comprises;
first storing means for storing condition data indicating conditions of said image forming apparatus, and
transmitting means for transmitting said condition data to said central control unit when connected to said central control unit and disconnected from said image forming apparatus,
said central control unit comprises,
means for receiving the condition data transmitted from said portable maintenance device,
third storing means for storing said received condition data,
means for producing guide information for indicating a procedure of maintenance work for said image forming apparatus on the basis of the condition data stored in said third storing means, and
means for transmitting said produced guide information to said portable maintenance device, and
said portable maintenance device further comprises,
means for receiving guide information transmitted from said central control unit,
second storing means for storing said received guide information,
display means, and
display control means for controlling said display means so that said maintenance work procedure is displayed on the basis of said stored condition data and said stored guide information.

22. The control system according to claim 21, wherein
said image forming apparatus comprises;
detecting means for detecting conditions of said image forming means, and
means for transmitting said detected condition data to said portable maintenance device on the basis of the detected result by said detecting means when said portable maintenance device is connected thereto, and
said portable maintenance device comprises;
means for receiving the condition data from said image forming apparatus when connected to said image forming apparatus, and
said first storing means storing said received condition data.

23. The system according to claim 3, further comprising means for downloading diagnostic data related to malfunctions from said central control unit into the storing means when said portable maintenance device is connected to said central control unit.

24. A control system of an image forming apparatus, comprising:
a portable maintenance device connectable to said image forming apparatus for data communications, said portable maintenance device including storing means for storing guide information indicating maintenance procedures for said image forming apparatus;

said image forming apparatus including an image forming means for forming images on paper and detecting means for detecting condition of the image forming means;

selecting means for selecting guide information stored in said stored means in accordance with the condition detected by said detecting means; and character display means for displaying the selected guide information.

25. The control system according to claim 24, further comprising a central control unit which is distant from said image forming apparatus, said portable maintenance device being connectable to the central control unit.

26. The control system according to claim 25, wherein said central control unit comprises means for downloading said guide information into said storing means when said portable maintenance device is connected to said central control unit.

27. The control system according to claim 25, wherein said storing means, when said portable maintenance device is connected to said image forming apparatus, stores data corresponding to the condition detected by said detecting means, and said system comprises transmitting means for transmitting the stored data corresponding to the condition to said central control unit when said portable maintenance device is connected to said central control unit.

28. The system of claim 3, wherein said central control unit further comprises:

first communication means for indirectly communicating with said image forming apparatus via a telephone line, and second communication means, including said second receiving means, for directly communicating with said portable maintenance device.

29. The system of claim 3, wherein said portable maintenance device further comprises:

image reading means for scanning a copy produced by said image forming apparatus, wherein a resultant image is stored in a storage means as condition data.

30. The system of claim 3, wherein said portable maintenance device further comprises:

third receiving means for receiving guidance data when connected to said central control unit, and third transmitting means for transmitting signals to said image forming apparatus.

31. A portable maintenance device connectable to each of an image forming apparatus and a central control unit for controlling said image forming apparatus, comprising:

receiving means for receiving condition data indicating conditions of said image forming apparatus transmitted from said image forming apparatus when connected to said image forming apparatus;

storing means for storing said received condition data;

transmitting means for transmitting the condition data stored in said storing means to said central controlling unit when connected to said central control unit; and means for downloading diagnostic data related to malfunctions from said central control unit into the storing means when said portable maintenance device is connected to said central control unit.

32. A portable maintenance device connectable to each of an image forming apparatus and a central control unit for controlling said image forming apparatus, comprising:

receiving means for receiving condition data indicating conditions of said image forming apparatus transmitted from said image forming apparatus when connected to said image forming apparatus;

storing means for storing said received condition data;

transmitting means for transmitting the condition data stored in said storing means to said central controlling unit when connected to said central control unit; and image reading means for scanning a copy produced by said image forming apparatus, wherein a resultant image is stored in said storing means as condition data.

33. A portable maintenance device connectable to each of an image forming apparatus and a central control unit for controlling said image forming apparatus, comprising:

receiving means for receiving condition data indicating conditions of said image forming apparatus transmitted from said image forming apparatus when connected to said image forming apparatus and for receiving guidance data when connected to said central control unit;

storing means for storing said received condition data; and transmitting means for transmitting the condition data stored in said storing means to said central controlling unit when connected to said central control unit and for transmitting signals to said image forming apparatus when connected thereto.

* * * * *